United States Patent
Ho et al.

(10) Patent No.: US 7,632,705 B2
(45) Date of Patent: Dec. 15, 2009

(54) METHOD OF HIGH PRECISION PRINTING FOR MANUFACTURING ORGANIC THIN FILM TRANSISTOR

(75) Inventors: Jia-Chong Ho, Taipei County (TW); Liang-Ying Huang, Taichung County (TW); Tarng-Shiang Hu, Hsinchu (TW); Cheng-Chung Lee, Taitung (TW)

(73) Assignee: Industrial Technology Research Institute, Hsinchu (TW)

( * ) Notice: Subject to any disclaimer, the term of this patent is extended or adjusted under 35 U.S.C. 154(b) by 74 days.

(21) Appl. No.: 11/121,033

(22) Filed: May 4, 2005

(65) Prior Publication Data

US 2005/0272212 A1 Dec. 8, 2005

(30) Foreign Application Priority Data

Aug. 6, 2004 (TW) ............................... 93123561 A

(51) Int. Cl.
*H01L 51/40* (2006.01)
(52) U.S. Cl. .......................................... 438/99; 257/40
(58) Field of Classification Search .................. 438/99, 438/158; 257/40
See application file for complete search history.

(56) References Cited

U.S. PATENT DOCUMENTS

| 6,335,539 | B1 * | 1/2002 | Dimitrakopoulos et al. | ... 257/40 |
| 7,211,463 | B2 * | 5/2007 | Hu et al. | ........................ 438/99 |
| 2003/0160235 | A1 * | 8/2003 | Hirai | ............................ 257/40 |

* cited by examiner

*Primary Examiner*—Walter L Lindsay, Jr.
*Assistant Examiner*—Reema Patel
(74) *Attorney, Agent, or Firm*—WPAT, PC; Justin King

(57) ABSTRACT

A method of high precision printing for manufacturing organic thin film transistor, comprising the following steps of: forming a gate on a substrate; forming an insulator layer on the substrate; forming a conducting wire electrode film on the insulator layer; forming a organic interlayer; forming a organic semiconductor layer on the organic interlayer; forming a polymer layer for channel length on the organic semiconductor layer; forming a organic electrode film; and forming a protective layer. Moreover, a means for forming layers of above mentioned method is a high precision printing selected from the consisting of Inkjet Printing, Screen Printing, Blade Coating, Roller Coating, Nanoimprinting, Micro Contact Printing, Flexographic printing, Table coating and Spin Coating, etc.

10 Claims, 2 Drawing Sheets

METHOD OF HIGH PRECISION PRINTING FOR MANUFACTURING ORGANIC THIN FILM TRANSISTOR

FIELD OF THE INVENTION

The present invention relates to a method of high precision printing for manufacturing organic thin film transistor, and more particularly, to a method combined with high precision printing and interlayer for manufacturing organic thin film transistor.

BACKGROUND OF THE INVENTION

In generally, the organic thin film transistor (OTFT) is manufactured by the material of conjugated polymers or organic small molecular materials. Comparing with inorganic transistor, the organic thin film transistor can be manufactured at low temperature, so we can select the plastic with light, thin, and cheap to replace the glass substrate. Furthermore, the processes of OTFT are simpler, and using high precision printing to pattern organic thin film can reduce the number of masks and vacuum evaporation equipments. The processes of OTFT are suitable for a plastic substrate, so that it suitable for a roll to roll process in the future and it can also reduce the cost of manufacturing thin film transistor.

In 2003, Royal Philips Electronics disclosed that manufacturing OTFT-EPD by using the soluble pentacene, wherein the device of OTFT is formed on a plastic substrate, and it is a Bottom-Contact/Bottom-Gate structure, and the material of the electrode (gate/source/drain) is Au, and using shadow mask process to form the electrode (gate/source/drain), and using the spin coating to form semiconductor layer with the soluble pentacene.

In summary, the conventional method for manufacturing an organic thin film transistor exists at least the following shortcomings:

1. The conventional method adopts the shadow mask process to form the electrode and spin coating to form semiconductor layer such that the cost of equipments required in the process is increased and thus the competitiveness is decreased.
2. The conventional method for manufacturing an organic thin film transistor uses shadow mask process to form the electrode to be reducing the solution of conducting wire, making a shorting of electrode, and increasing difficult of conducting line design.
3. The conventional method for manufacturing an organic thin film transistor may cause an environmental problem, since the soluble pentacene used in the conventional method had to be dissolved in the chloroform that is the most industry country prohibited.

SUMMARY OF THE INVENTION

It is the primary object of the present invention to provide a method of high precision printing for manufacturing organic thin film transistor, comprising the steps of: using the thermal evaporation to deposit the pentacene; combining the process of interlayer; using high precision printing to pattern directly, by which the present invention reduces the cost of equipment required in the manufacturing process and increases the commercial competitiveness of the same.

It is another object of the present invention to provide a method of high precision printing for manufacturing organic thin film transistor, which using high precision printing to pattern directly can increase the resolution of conducting wire and prevent from a short circuit and decrease difficult of wiring.

Yet, another object of the present invention is to provide a method of high precision printing for manufacturing organic thin film transistor, which not needs the chloroform to be a solvent of pentacene, so the present invention has no environmental problem.

In order to achieve the afore the objects, the present invention provides a preferred embodiment of the method of high precision printing for manufacturing organic thin film transistor, comprising the steps of:
(a) forming a gate on a substrate;
(b) forming an insulator layer on the substrate;
(c) forming a conducting wire electrode film on the insulator layer;
(d) forming an organic interlayer;
(e) forming an organic semiconductor layer on the organic interlayer;
(f) forming a polymer layer for channel length on the organic semiconductor layer;
(g) forming an organic electrode film; and
(h) forming a protective layer.

Wherein, the high precision printing consists of the Inkject Printing, the Screen Printing, the Blade Coating, the Roller Coating, the Nanoimprinting, the Micro Contact Printing, the Spin Coating, the table coating, etc.

DETAILED DESCRIPTION OF THE INVENTION

Matched with corresponding drawings, the preferable embodiments of the invention are presented as following and hope they will benefit your esteemed reviewing committee members in reviewing this patent application favorably.

Please refer to FIG. 1A to FIG. 1H, which shows the preferred embodiment of the method of high precision printing for manufacturing organic thin film transistor according to the present invention.

Figure 1A:
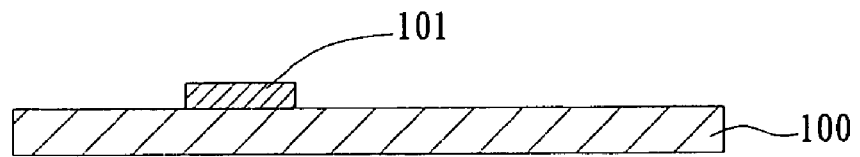
FIG. 1A to FIG. 1H is the schematic view showing a preferred embodiment of the method of high precision printing for manufacturing organic thin film transistor.

As shown in the FIG. 1A, a plastic substrate 100 is provided. After cleaning the plastic substrate 100 so as to remove organic matters and small particles, a conducting material of Chromium (Cr) or indium tin oxide (ITO) is deposited on the plastic substrate 100 by using vacuum evaporation, and then patterns them to form a gate 101 on the plastic substrate 100 by using photolithography and etching process or laser ablation process.

Figure 1B:
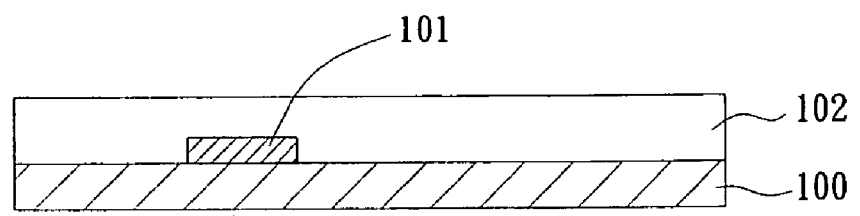

As shown in the FIG. 1B, using the Flexographic printing, Die Coating or Spin Coating or table coating, etc. to coat an insulator layer 102 on the plastic substrate 100, wherein the insulator layer 102 is a material selected from the group consisting of organic solvent, inorganic solvent and mixing of the two.

Figure 1C:
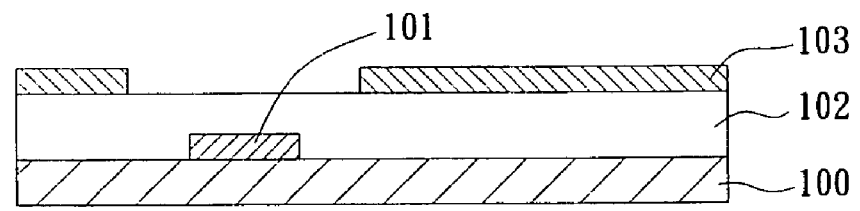

As shown in the FIG. 1C, a conducting material of Chromium (Cr) or indium tin oxide (ITO) is deposited on the insulator layer 102 by using vacuum evaporation, and then patterns them to form a conducting wire electrode film 103 on the insulator layer 102 by using photolithography and etching process or laser ablation process.

Figure 1D:
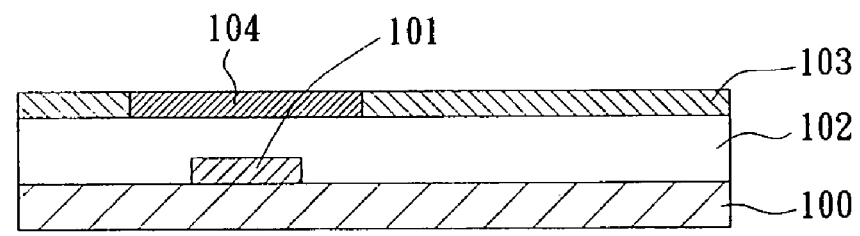

As shown in the FIG. 1D, the organic interlayer 104 formed in the channel of OTFT is substantially a photo-alignment film made of polyimide. The organic interlayer 104 can improve the grain size of material so as to raise the mobility of carriers for OTFT and improve device performance.

Figure 1E:
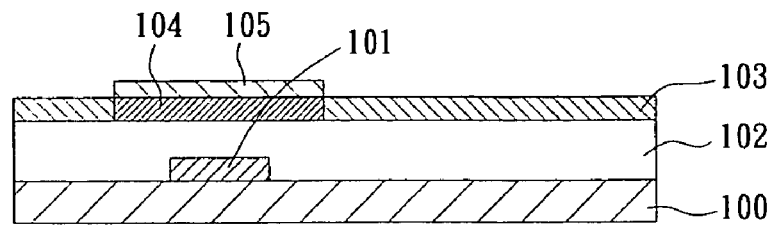

As shown in the FIG. 1E, a material of polymer semiconductor or organic small molecule is deposited on the organic interlayer 104 by using thermal evaporation or vapor phase deposition, etc. to form an organic semiconductor layer 105. The organic interlayer 104 can improve the grain size of the organic semiconductor layer 105 to grow up, so the organic semiconductor layer 105 has better electricity, and in another word, the OTFT has better electricity.

Figure 1F:
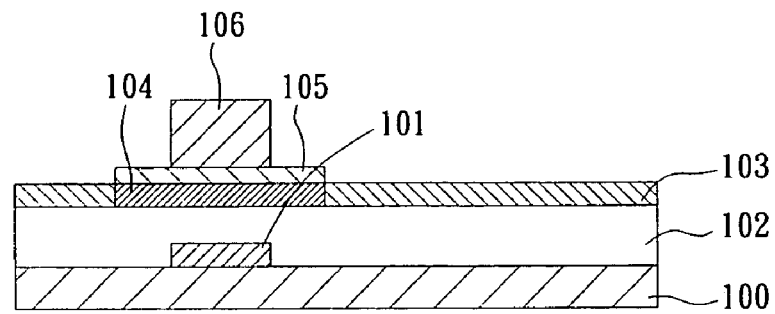

As shown in the FIG. 1F, using the Screen Printing or the Flexographic printing or the Spin Coating or table coating, etc. to deposit a material of polymer, and then using photolithography and etching process to form a polymer layer for channel length 106 on the organic semiconductor layer 105. The polymer layer for channel length 106 can use hydrophilic polymer or hydrophobic polymer. The thickness of the polymer layer for channel length 106 is about double of the thickness of the organic semiconductor layer 105.

Figure 1G:
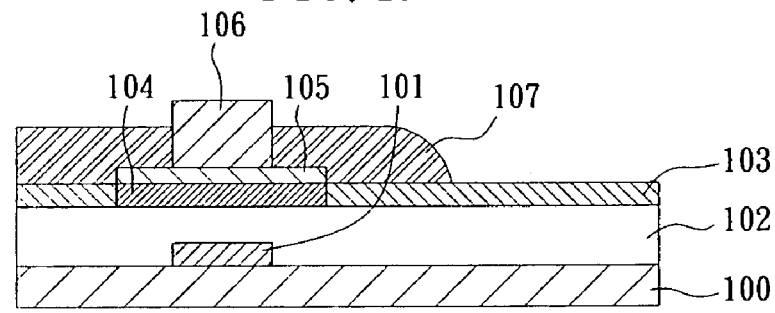

As shown in the FIG. 1G, a material of an organic conductor or a mixture of organic and inorganic conductor is deposited on the conducting wire electrode film 103 and the organic semiconductor layer 105 by using Inkject Printing or Screen Printing or Spin Coating, etc. to form an organic electrode film 107.

In the preferable embodiment, there are two reasons to separate the process of manufacturing the data line for OTFT (the polymer layer for channel length 106) and the Drain/Source (the organic electrode film 107). The first, the electrode structure of top contact must be deposited on the organic semiconductor layer 105. So the photolithography process is needed, but the chemicals of photolithography process will destroy the structure of the organic semiconductor layer 105. The second, since the electric conductivity of organic conducting materials is low, and the organic conducting materials used to data line will produce the voltage drop to make the OTFT failure. Forming data line by using metal or conducting oxide to prevent the resistance of data line from rising, and then patterning directly the organic conducting material to form Drain/Source by using high precision printing.

Figure 1H:
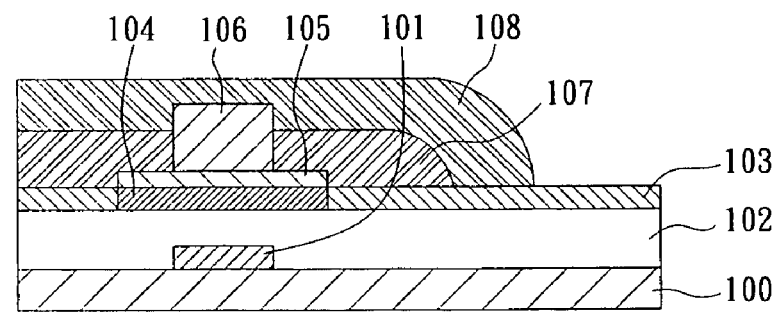

As shown in the FIG. 1H, in the same, using Inkject Printing or Screen Printing or Flexographic printing or Blade Coating or Roller Coating or Nanoimprinting or Micro Contact. Printing or the Spin Coating, or Table coating, etc. to form a protective layer 108. The protective layer 108 further comprises: a PVA, a PVP and a PI so as to protect the OTFT. Finally, the structure of top contact/bottom gate for OTFT is completed.

In summary, the present invention comprises the steps of: combining the process of interlayer; using high precision printing to pattern directly, by which the present invention can increase the resolution of conducting wire and prevent from a short circuit and decrease difficult of wiring. However, the aforementioned are just several preferable embodiments according to the present invention and, of course, can not used to limit the scope of the present invention, so any equivalent variation and modification made according to the claims in the present invention are all still covered by the present invention.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments, which do not depart from the spirit and scope of the invention.

What is claimed is:

1. A method of high precision printing for manufacturing organic thin film transistor, comprising the steps in series of:
    (a) forming a gate on a substrate;
    (b) forming an insulator layer on the substrate;
    (c) forming a conducting wire electrode film with a pattern on the insulator layer, wherein the pattern is above the gate;
    (d) forming an organic interlayer in the pattern and on the insulator layer;
    (e) forming an organic semiconductor layer on the organic interlayer;
    (f) forming a polymer layer for channel length on the organic semiconductor layer;
    (g) forming an organic electrode film; and
    (h) forming a protective layer.

2. The method as recited in claim 1, wherein the substrate is a substrate selected from the group consisting of a plastic substrate, a metal foil substrate, a glass substrate and an organic/inorganic hybrid substrate.

3. The method as recited in claim 1, wherein the gate is made of a material selected from the group consisting of metal, conductive oxide, organic material and organic/inorganic hybrid material.

4. The method as recited in claim 1, wherein the insulator layer is made of a material selected from the group consisting of organic, inorganic and organic/inorganic hybrid material.

5. The method as recited in claim 1, wherein the conducting wire electrode film is made of a material selected from the group consisting of metal or conductive oxide or organic or organic/inorganic hybrid material.

6. The method as recited in claim 1, wherein the organic interlayer is substantially a photo-alignment film made of polyimide.

7. The method as recited in claim 1, wherein the organic semiconductor layer is made of a material selected from the group consisting of polymer semiconductor, organic small molecule, and organic/inorganic hybrid material.

8. The method as recited in claim 1, wherein the polymer layer for channel length is made of a material selected from the group consisting of hydrophilic polymer and hydrophobic polymer.

9. The method as recited in claim 1, wherein the organic electrode film is made of a material selected from the group consisting of an organic conductor and a mixture of organic and inorganic conductor.

10. The method as recited in claim 1, wherein the protective film further comprises a polyvinyl acetate layer (PVA), a PVP layer, and a PI layer.

* * * * *